(12) United States Patent
Hirler et al.

(10) Patent No.: US 8,853,776 B2
(45) Date of Patent: Oct. 7, 2014

(54) POWER TRANSISTOR WITH CONTROLLABLE REVERSE DIODE

(75) Inventors: Franz Hirler, Isen (DE); Lutz Goergens, Oberasbach (DE); Martin Feldtkeller, Munich (DE)

(73) Assignee: Infineon Technologies Austria AG, Villach (AT)

(*) Notice: Subject to any disclaimer, the term of this patent is extended or adjusted under 35 U.S.C. 154(b) by 309 days.

(21) Appl. No.: 13/238,576

(22) Filed: Sep. 21, 2011

(65) Prior Publication Data

US 2013/0069710 A1  Mar. 21, 2013

(51) Int. Cl.
| | |
|---|---|
| *H01L 29/772* | (2006.01) |
| *H01L 29/739* | (2006.01) |
| *H01L 29/78* | (2006.01) |
| *H01L 29/06* | (2006.01) |
| *H01L 29/40* | (2006.01) |
| *H01L 29/417* | (2006.01) |

(52) U.S. Cl.
CPC ........ *H01L 29/0623* (2013.01); *H01L 29/7393* (2013.01); *H01L 29/7832* (2013.01); *H01L 29/7395* (2013.01); *H01L 29/7828* (2013.01); *H01L 29/7813* (2013.01); *H01L 29/7396* (2013.01); *H01L 29/7803* (2013.01); *H01L 29/782* (2013.01); *H01L 29/7817* (2013.01); *H01L 29/7806* (2013.01); *H01L 29/7831* (2013.01); *H01L 29/407* (2013.01); *H01L 29/7397* (2013.01); *H01L 29/41766* (2013.01); *H01L 29/0696* (2013.01)
USPC ..................... 257/334; 257/401; 257/E29.257

(58) Field of Classification Search
CPC .............. H01L 29/0619; H01L 29/407; H01L 29/7813
USPC ................... 257/334, 401, E29.257; 323/282
See application file for complete search history.

(56) References Cited

U.S. PATENT DOCUMENTS

| | | | |
|---|---|---|---|
| 2009/0090966 A1* | 4/2009 | Thorup et al. | 257/328 |
| 2009/0114986 A1* | 5/2009 | Hirler et al. | 257/334 |
| 2010/0078707 A1 | 4/2010 | Haeberlen et al. | |
| 2012/0306464 A1* | 12/2012 | Hirler et al. | 323/282 |

* cited by examiner

*Primary Examiner* — Jerome Jackson, Jr.
*Assistant Examiner* — Paul Budd
(74) *Attorney, Agent, or Firm* — Murphy, Bilak & Homiller, PLLC

(57) ABSTRACT

An electronic circuit includes a transistor device that can be operated in a reverse operation mode and a control circuit. The transistor device includes a source region, a drain region, a body region and a drift region, a source electrode electrically connected to the source region, a pn junction formed between the body region and the drift region, a gate electrode adjacent the body region and dielectrically insulated from the body region, and a depletion control structure adjacent the drift region. The depletion control structure has a control terminal and is configured to generate a depletion region in the drift region dependent on a drive signal received at the control terminal. The control circuit is coupled to the control terminal of the depletion control structure and configured to drive the depletion control structure to generate the depletion region when the transistor device is operated in the reverse operation mode.

28 Claims, 5 Drawing Sheets

POWER TRANSISTOR WITH CONTROLLABLE REVERSE DIODE

TECHNICAL FIELD

Embodiments of the present invention relate to a power transistor, specifically a power MOSFET.

BACKGROUND

A power MOSFET (metal oxide semiconductor field effect transistor) includes a source region, a body region, a drift region and a drain region. The body region is arranged between the source region and the drift region. The drift region is arranged between the body region and the drain region and adjoins the body region, and a pn junction is formed between the body region and the drift region. A power MOSFET further includes a gate electrode that is dielectrically insulated from the semiconductor regions of the transistor and that is configured to control a conducting channel in the body region between the source region and the drift region. The doping types of the source region, the body region and the drift region are such that these semiconductor regions form a parasitic bi-polar transistor, which is an npn transistor in an n-type MOSFET and a pnp transistor in a p-type MOSFET.

In order to prevent this parasitic transistor from having a negative impact on the functionality of the MOSFET, it is commonly known to short-circuit the source region and the body region. Through this, however, the MOSFET includes only one pn junction that can be reverse biased, namely the pn junction between the body region and the drift region. A conventional MOSFET is, therefore, only capable to block when a voltage is applied between the source region and the drain region that reverse biases the pn-junction, while the MOSFET conducts, independent of the control of the gate electrode, when a voltage is applied between the source region and the drain region that forward biases the pn junction. This pn junction is also known as body diode.

When the body diode is forward biased, a charge carrier plasma is accumulated mainly in the drift region. When the body diode is subsequently reverse biased the MOSFET still conducts until this charge carrier plasma has been removed. Thus, the body diode may increase the switching losses of the MOSFET and decrease the switching speed.

Further, there are applications, such as matrix converters, in which a reverse conduction of a MOSFET is highly undesirable.

There is therefore a need to avoid the problems outlined before.

SUMMARY

A first embodiment relates to an electronic circuit, including a transistor device and a control circuit. The transistor device can be operated in a reverse operation mode and includes a source region, a drain region, a body region and a drift region, a source electrode electrically connected to the source region and the body region, a pn junction formed between the body region and the drift region, a gate electrode arranged adjacent the body region and dielectrically insulated from the body region, and a depletion control structure arranged adjacent the drift region. The depletion control structure has a control terminal and is configured to generate a depletion region in the drift region dependent on a drive signal received at the control terminal. The control circuit is coupled to the control terminal of the depletion control structure and is configured to drive the depletion control structure to generate the depletion region when the transistor device is operated in the reverse operation mode.

A second embodiment relates to a method of operating a transistor device. The transistor device can be operated in a reverse operation mode and includes a source region, a drain region, a body region and a drift region, a source electrode that is electrically connected to the source region and the body region, a pn junction formed between the body region and the drift region, a gate electrode arranged adjacent the body region and dielectrically insulated from the body region, and a depletion control structure arranged adjacent the drift region, having a control terminal, and configured to generate a depletion region in the drift region dependent on a drive signal received at the control terminal. The method comprises driving the depletion control structure to generate the depletion region when the transistor device is operated in the reverse operation mode.

Those skilled in the art will recognize additional features and advantages upon reading the following detailed description, and upon viewing the accompanying drawings.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

In the following Detailed Description, reference is made to the accompanying drawings, which form a part thereof, and in which is shown by way of illustration specific embodiments in which the invention may be practiced. In this regard, directional terminology, such as "top", "bottom", "front", "back", "leading", "trailing" etc., is used with reference to the orientation of the FIGS. being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
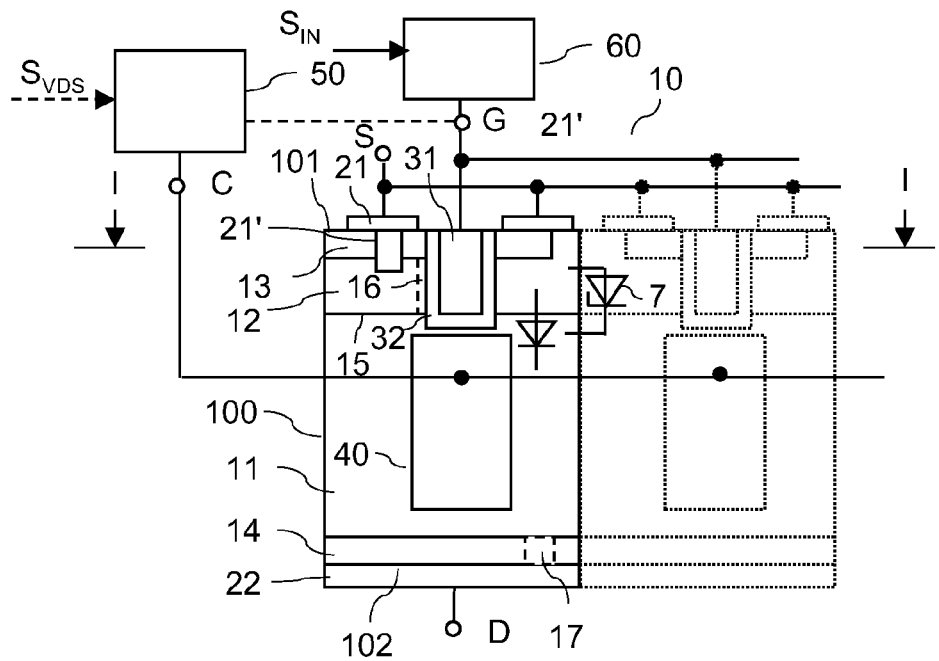
FIG. 1 illustrates a first embodiment of an electronic circuit including a vertical transistor device with a trench gate electrode and a depletion control structure, and including a control circuit coupled to the depletion control structure.

FIG. 1 illustrates a first embodiment of an electronic circuit including a transistor device 10 and a control circuit 50. In FIG. 1, a vertical cross sectional view of a part of the transistor device 10 is illustrated. The control circuit 50 that is coupled to a control terminal C of the transistor device 10 is illustrated as a function block. The operating principle of the control circuit 50 is explained in further detail below.

The transistor device 10 includes a semiconductor body 100. The semiconductor body 100 may include a conventional semiconductor material, such as silicon (Si), silicon carbide (SiC), gallium arsenide (GaAs), or the like. The semiconductor body 100 has a first surface 101 and a second surface 102 opposite the first surface 101. FIG. 1 illustrates a vertical cross sectional view of the semiconductor body 100, which is a sectional view in a vertical section plane that extends perpendicular to the first and second surfaces 101, 102.

In the semiconductor body 100 active regions of the transistor device 10, which in the embodiment according to FIG. 1 is implemented as a MOS transistor, such as a MOSFET or an IGBT (insulated gate bipolar transistor), are integrated. These active transistor regions include a drift region 11, a body region 12, a source region 13 and a drain region 14. The body region 12 is arranged between the source region 13 and the drift region 11, and the drift region 11 is arranged between the body region 12 and the drain region 14. The body region 12 is doped complementarily to the source region 13 and the drift region 11, so that a pn junction 15 is formed between the body region 12 and the drift region 11. In a transistor device implemented as a MOSFET the drain region 14 has the same doping type as the drift region 11, while in a transistor device implemented as an IGBT the drain region 14 is doped complementarily to the drift region 11. The drain region 14 may adjoin the drift region 11. According to a further embodiment, a field-stop region (not illustrated) of the same doping type as the drift region 11, but more highly doped than the drift region 11, is arranged between the drift region 11 and the drain region 14.

A further pn junction is formed between the source region 13 and the body region 12. However, this pn junction may not be electrically active, in case the body region 12 and the source region 13 are electrically connected to a source electrode 21, that forms or is connected to a source terminal S of the transistor device 10. In the embodiment illustrated in FIG. 1, the source electrode 21 is arranged on the first surface 101. Referring to what is shown in the right part of FIG. 1, sections of the body region 12 may extend to the first surface 101 where they are electrically connected to the source electrode 21. According to a further embodiment, shown in the left part of FIG. 1, the source electrode 21 may include an electrode section 21' that extends through the source region 13 into the body region 12 in order to electrically contact both the source region 13 and the body region 12. However, these are only two of several different possibilities for electrically connecting the source and body regions 13, 12 to the source electrode 21.

A drain terminal D of the transistor device 10 can be formed by a drain electrode 22 that is electrically connected to the drain electrode 14.

The transistor device 10 further includes a gate electrode 31 arranged adjacent the body region 12 and dielectrically insulated from the semiconductor body 100 by a gate dielectric 32. The gate electrode 31 is electrically connected to or forms a gate terminal G of the transistor device 10. The gate electrode 31 according to FIG. 1 is implemented as a trench gate electrode, which means that the gate electrode 31 is arranged in a trench that extends from the first surface 101 into the semiconductor body 100. The trench with the gate electrode 31 extends through the body region 12 to or into the drift region 11. In a commonly known manner, the gate electrode 31 serves to control a conducting channel in the body region 12 between the source region 13 and the drift region 11 along the gate dielectric 32.

The transistor device 10 of FIG. 1 is implemented as a vertical transistor, which means that the source region 13 and the drain region 14 are arranged distant to each other in the vertical direction of the semiconductor body 100 and that a current flow direction of a load current flowing through the drift region 11 when the transistor device is in an on-state is the vertical direction of the semiconductor body 100.

The transistor device 10 can be implemented as an n-type MOSFET or a p-type MOSFET and can be implemented as an enhancement MOSFET or a depletion MOSFET. In an n-type MOSFET, the source region 13, the drift region 11 and the drain region 14 are n-doped, while the body region 12 is p-doped. In a p-type MOSFET, the source region 13, the drift region 11, and the drain region 14 are p-doped, while the body region 12 is n-doped. In an enhancement MOSFET, the body region 12 adjoins the gate dielectric 32. In this type of MOSFET, the gate electrode 31 serves to control an inversion channel in the body region 12 between the source region 13 and the drift region 11. In a depletion MOSFET, a channel region 16 (illustrated in dashed lines in FIG. 1) of the same doping type as the source region 13 and the drift region 11 extends between the source region 13 and the drift region 11 along the gate dielectric 32. In this type of MOSFET, the gate electrode 31 serves to interrupt the channel region 16 by controlling a depletion region in the channel region 16. The transistor device 10 could also be implemented as an IGBT, where an IGBT is different from a MOSFET in that the drain region 14 (which in an IGBT is also referred to as collector region) is doped complementarily to the drift region 11 and the source region 13 (which in an IGBT is also referred to as emitter region) and has the doping type as the body region 12. Usually, the source region 13 and the drift region 11 are n-doped in an IGBT, while the body region 12 and the drain region 14 are p-doped.

The basic operating principle of the transistor device 10 according to FIG. 1 is the basic operating principle of a conventional MOSFET or IGBT. The drive potentials of gate drive signals applied to the gate terminal G in order to switch on or switch off the transistor device 10 are dependent on the specific type of the transistor device 10. Just for illustration purposes, the operating principle of an n-type enhancement MOSFET or an IGBT is explained. The operating principle of a p-type enhancement MOSFET is equivalent to the operating principle of an n-type MOSFET, where the polarities of the voltage as explained below have to be inverted.

The drive potential applied to the gate electrode 31 can be provided by a gate drive circuit 60 coupled to the gate terminal G. The gate drive circuit 60 is configured to control a conducting channel in the body region 12 along the gate dielectric 32 dependent on a control signal $S_{IN}$ by suitably providing the drive potential. For example, in an n-type enhancement MOSFET, the gate drive circuit 60 biases the gate electrode 31 to a positive potential relative to the source potential in order to generate a conducting channel in the body region 12, so as to switch the MOSFET on. In order to switch the MOSFET off, the gate potential is generated such that it is not high enough for generating the conducting channel.

An n-type MOSFET or IGBT is capable of blocking a positive voltage applied between the drain terminal D and the source terminal S. A positive voltage is a voltage that has a positive potential at the drain terminal D and a negative potential or reference potential at the source terminal S. The MOSFET is blocking (in an off-state) when the gate electrode 31 is driven such that there is no conducting channel in the body region 12 between the source region 13 and the drift region 11. This can be obtained by applying a gate drive voltage between the gate terminal G and the source terminal S that is below a threshold voltage ($V_{TH}$) of the MOSFET. When a positive voltage is applied between the drain terminal D and the source terminal S, and the MOSFET is blocking, a depletion layer expands in the drift region 11 beginning at the pn junction 15 between the drift region 11 and the body region 12. A doping concentration and a length of the drift region 11 mainly defines the voltage blocking capability of the MOSFET. The length of the drift region 11 is the dimension of the drift region 11 in the current flow direction. The doping concentration of the drift region 11 is, for example, between $10^{12} cm^{-3}$ and $10^{18} cm^{-3}$, the doping concentration of the body region 12 is, for example, between $10^{15} cm^{-3}$ and $10^{19} cm^{-3}$, and the doping concentrations of the source region 13 and the drain region 14 are, for example, between $10^{19} cm^{-3}$ and $10^{23} cm^{-3}$.

An operation state in which the pn junction 15 is reverse biased will be referred to as forward operation of the MOSFET in the following. An n-type MOSFET or IGBT is in the forward operation when a positive voltage is applied between the drain and the source terminals D, S and a p-type MOSFET is in the forward operation, when a negative voltage is applied between the drain and the source terminals D, S.

A transistor device 10 implemented as a MOSFET may conduct a current, independent of a gate drive voltage applied to the gate electrode G, when a voltage is applied between the drain and source terminals D, S that forward biases the pn junction 15 between the body region 12 and the drift region 11. In an n-type MOSFET the voltage to be applied between the drain and source terminals D, S in order to forward bias the pn junction 15 is a negative voltage between drain D and source S (a positive voltage between source S and drain D), and in a p-type transistor, the voltage that forward biases the pn junction 15 is a positive voltage between drain D and source S (a negative voltage between source S and drain D). The pn junction 15 between the body region 12 and the drift region 11 forms a diode that is commonly known as body diode. The electric symbol of this diode is schematically illustrated in FIG. 1 for an n-type transistor.

MOSFETs, such as a power MOSFET illustrated in FIG. 1, are widely used as electronic switches in a plurality of different applications. While there are applications in which the presence of the body diode is helpful and in which the body diode is used as a freewheeling element, there are applications in which the body diode is not desired, which means that it is not desired for the MOSFET to conduct a current when a voltage is applied between the drain and source terminals D, S that biases the body diode in its forward direction.

An operating state of the transistor device 10 in which a drain-source voltage is applied between the drain and source terminals D, S that has a polarity different from the polarity of the drain-source voltage in the forward operation mode will be referred to as reverse operation of the MOSFET in the following. An n-type MOSFET or an IGBT is in the reverse operation mode when the drain-source voltage applied between the drain and the source terminals D, S is a negative voltage, while a p-type MOSFET is in the reverse operation mode when the drain-source voltage applied between the drain and the source terminals D, S is a positive voltage. The drain-source voltage in the reverse operation mode has a polarity that forward biases the pn junction (body diode) between the body region 12 and the drift region 11. The voltage in the reverse operation mode will be referred to as reverse voltage in the following. However, referring to the explanation provided herein below, measures may be taken that prevent the drain-source voltage in the reverse operation mode from reaching an amplitude that causes the pn-junction to conduct a current. A current conduction of a MOSFET when operated in the reverse mode will be referred to as reverse conduction in the following.

The reverse conduction of a conventional MOSFET results from electrically connecting the source region, such as source region 13 of FIG. 1 and the body region, such as body region 12 of FIG. 1, to the source electrode, such as source electrode 21 in FIG. 1. Through this, the body region 12 and the source region 13 are short-circuited, so that a parasitic bipolar transistor formed by the drift region 11, the body region 12 and the source region 13, that would basically allow to block positive and negative voltages applied between the drain and source terminals D, S when the MOSFET is switched off, is degraded to the body diode which only blocks when the MOSFET is in the forward operation mode. The MOSFET could also be implemented as a reverse-blocking (RB) MOSFET in which there is no short circuit between the source region 13 and the body region 12, so that there is an effective pn junction between the source region 13 and the body region 12. However, because of relatively high doping concentrations of the source region 13 and the body region 12, a blocking capability of this pn-junction is rather low and is too low for many applications. It is, therefore desirable, to be able to deactivate the body diode in order to obtain a reverse blocking capability or in order to increase the voltage blocking capability in the reverse direction.

Referring to FIG. 1, the transistor device 10 includes a depletion control structure 40 arranged adjacent the drift region 11. The depletion control structure 40, which is only schematically illustrated in FIG. 1, includes a control terminal C and is configured to generate a depletion region in the drift region 11 dependent on a drive signal applied to the control terminal C. This depletion region pinches off a conducting channel in the drift region 11 between the drain region 14 and the body region 12, so that the depletion control structure 40 is capable of "deactivating" the body diode. When the conducting channel in the drift region 11 is pinched off, a current does not flow via the body diode independent on the polarity of a voltage applied between the drain and source terminals D, S, so that the transistor device 10 blocks even when operated in the reverse operation mode, which is when a reverse voltage is applied between the drain and source terminals D, S.

The control circuit 50 coupled to the control terminal C of the depletion control structure 40 is configured to drive the depletion control structure 40 such that a depletion region is generated in the drift region 11 whenever a voltage (drain-source voltage) is applied between the drain and source terminals D, S, that forward biases the pn junction 15. According to one embodiment (illustrated in dashed lines), the control circuit 50 receives a voltage signal $S_{VDS}$ that represents a voltage between the drain and source terminals D, S or that at least represents a polarity of this voltage between the drain and source terminals D, S. The control circuit 50 is configured to determine a polarity of the drain-source voltage and to generate a depletion region in the drift region 11 when the polarity of the drain-source voltage is such that the pn junction 15 is forward biased.

The generation of a depletion region in the drift region 11 further requires that the injection of charge carriers from the body region 12 into the drift region 11 is prevented when the device is operated in the reverse direction. These charge carriers are p-type charge carriers (holes) when the body region 12 is p-doped and n-type charge carriers when the body region 12 is n-doped. The body region 12 injects charge carriers into the drift region 11 when a voltage that forward biases the pn-junction between the body region 12 and the drift region 11 reaches a forward voltage of the pn-junction or of the body diode, respectively. In a silicon device, this forward voltage is about 0.6V.

In order to prevent the body region 12 from injecting charge carriers when the transistor device is operated in the reverse operation mode, means are taken that clamp the voltage between the body region 12 and the drift region 11 to a voltage below the forward voltage. These means may include connecting a clamping element 7 between the body region 12 and the drift region 11. According to one embodiment, this clamping element 7 is a unipolar clamping diode having a forward voltage lower than the forward voltage of the body diode. According to one embodiment, this diode is a Schottky diode or a MOS Gated Diode (MGD)

Figure 2:
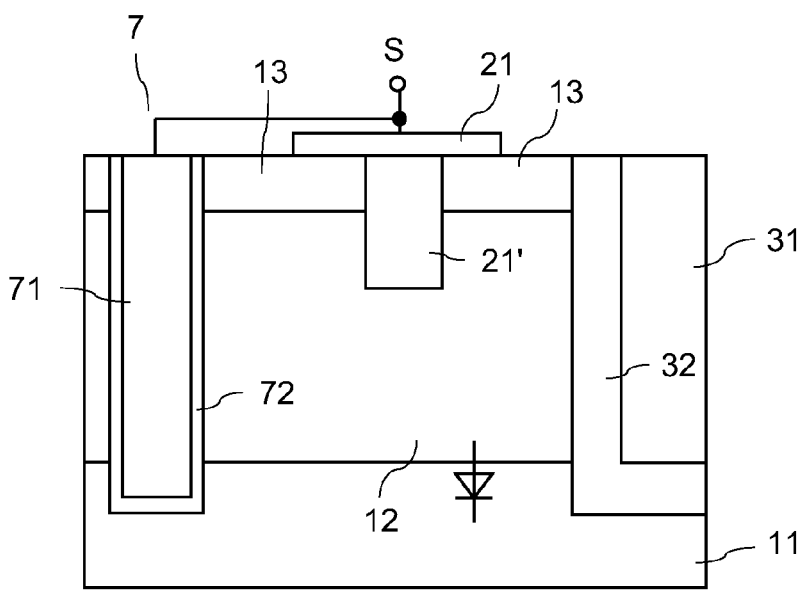
FIG. 2 illustrates a vertical cross sectional view of a transistor device including a MOS Gated Diode as a clamping element.

FIG. 2 illustrates a vertical cross sectional view of a vertical transistor in which an MGD as a clamping element 7 is implemented. It should be noted that in FIG. 2 only those sections of the semiconductor body 100 are shown in which the MGD is implemented. The MGD includes a further gate electrode 71 that is arranged in a trench extending through the source and body regions 13, 12 into the drift region 11. The further gate electrode 71 is dielectrically insulated from these device regions by a further gate dielectric 72. This further gate dielectric 72 may be thinner than the gate dielectric of the vertical transistor so that a threshold voltage of the MGD is lower than the threshold voltage of the vertical transistor. The further gate electrode 71 is electrically connected to the source region 13 or the source terminal S, respectively. The further gate electrode 71 generates a conducting channel in the body region 12 between the drift region 11 and the source region 13 each time the electrical potential of the drift region 11 is more than the threshold voltage of the MGD above the electrical potential of the source and body regions 13, 12. The threshold voltage of the MGD is lower than the forward voltage of the body diode, so that the MGD bypasses the body diode before the body diode is forward biased.

Figure 3:
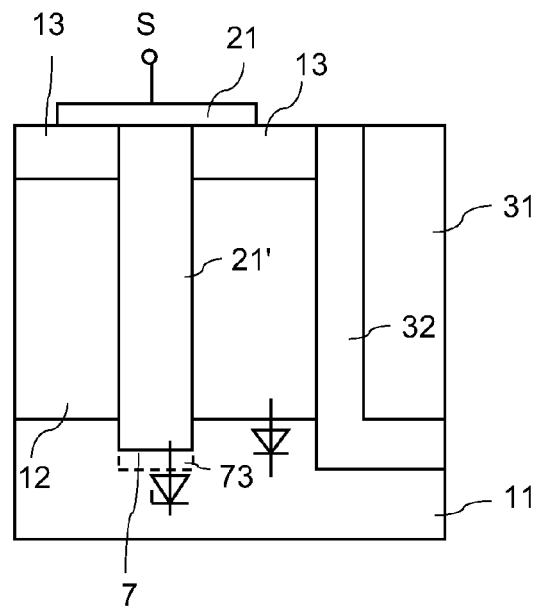
FIG. 3 illustrates a vertical cross sectional view of a transistor device including a Schottky diode as a clamping element.

FIG. 3 illustrates a vertical cross sectional view of a vertical transistor in which a Schottky diode as a clamping element 7 is implemented. It should be noted that in FIG. 3 only those sections of the semiconductor body 100 are shown in which the Schottky diode is implemented. In the embodiment illustrated in FIG. 3, the Schottky diode is connected between the source terminal S and the drift region 11. The Schottky diode includes the source electrode 21 or a section of the source electrode 21' that extends through the source and body regions 13, 12 to or into the drift region 11. The source electrode 21' includes a Schottky metal at least in those regions where it contacts the drift region 11. Optionally, the drift region 11 includes a higher doped region 73 of the same doping type as the drift region 11 in those regions where the source electrode 21' contacts the drift region 11.

Only for illustration purposes, a Schottky diode 7 connected between the body region 12 and the drift region 11 is illustrated in FIG. 1. When there is a short circuit between the source region 13 and the body region 12, the clamping diode 7 can be connected between the source region 13 or the source electrode 21 and the drift region 11. The clamping diode 7 can be integrated in the same semiconductor body 100 as the transistor device 10.

Alternatively or additionally to providing the clamping diode 7, the voltage between the body region 12 and the drift region 11 can be clamped by driving the gate electrode 31 to generate a conducting channel in the body region 12 between the source region 13 and the drift region 11 when the transistor device 10 is in the reverse operation mode. The voltage that drops across this conducting channel is below the forward voltage of the body diode. According to one embodiment, the control circuit 50 is also coupled to the gate terminal G and is configured to drive the gate electrode 31 to generate a conducting channel in the body region 12 when the control circuit drive 50 drives the depletion control structure 40 to generate a depletion region in the drift region 11.

A transistor device 10 in which the voltage between the drain and source terminals D, S is only clamped by suitably driving the gate electrode 31, so that there is no additional clamping element, can be operated in two different sub-modes in the reverse operation mode: In a first sub-mode, the gate electrode 31 is driven to generate a conducting channel in the body region 12 so as to clamp the drain-source voltage to a value below the forward voltage of the body diode; in a second sub-mode, the transistor device 10 is operated like a conventional transistor device in the reverse operation mode, which means the drain-source voltage is not clamped so that the body diode conducts a current. In the first sub-mode, the transistor device 10 acts like a unipolar diode, while in the second sub-mode the transistor device 10 acts like a bipolar diode.

An IGBT has at least two electrically active pn junctions, namely a first pn junction between the body region 12 and the drift region 11, forming the body diode, and a second pn junction between the drift region 11 and the drain region 14. Since these first and second pn junctions form a pnp or npn structure, an IGBT does not conduct when operated in the reverse mode so that at a first glance deactivating the body diode in an IGBT would not have an effect. However, by deactivating the body diode in an IGBT the reverse voltage blocking capability of an IGBT can be increased, so that the explanations provided above in connection with a MOSFET apply to an IGBT accordingly.

Referring to FIG. 1, the transistor device 10 may include a plurality of transistor cells connected in parallel. In FIG. 1, one additional transistor cell is illustrated in dotted lines. Each transistor cell includes a source region 13, a body region 12 and a section of the gate electrode 31. The drift region 11 and the drain region 14 may be common to the individual transistor cells. The source region 13 of each transistor cell is connected to the source terminal, and the gate electrode section 31 of each transistor cell is electrically connected to the gate terminal G. In FIG. 1, four transistor cells are illustrated, wherein two neighboring transistor cells share one gate electrode section 31. Referring to FIG. 1, each transistor cell may include one depletion control structure 40, wherein one depletion control structure 40 may be common to two neighboring transistor cells.

Figure 4:
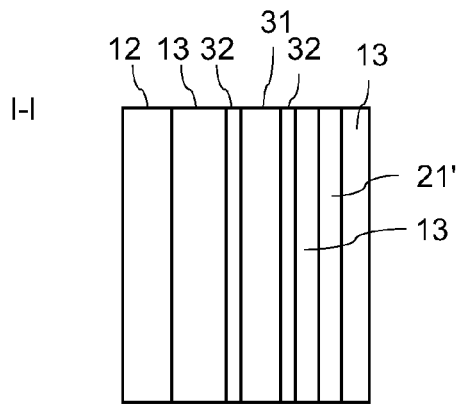
FIG. 4 illustrates a horizontal cross sectional view of the transistor device.

The individual transistor cells may have a conventional transistor cell topology. Just for illustration purposes, one possible topology, namely a stripe-topology of the transistor cells is illustrated in FIG. 4. FIG. 4 shows a horizontal cross sectional view of the semiconductor body 100 in a horizontal section plane I-I indicated in FIG. 1 that cuts through the body region 12, the source region 13 and the gate electrode 31 of two cells. As can be seen from FIG. 4, the body regions 12, the source regions 13 and the gate electrode section 31 have a longitudinal or stripe-like geometry. It should be noted that FIG. 4 only shows a section of the semiconductor body 100. The semiconductor body 100 may further include a connection trench with a gate connection electrode extending perpendicular to the gate electrode sections 31 in FIG. 1. This gate connection electrode is electrically connected to the gate electrode sections 31 in the individual trenches and is, for example, electrically connected to the gate terminal G. Further, the semiconductor body 100 may include sections in which the gate control structure 40 or a contact electrode of the gate control structure 40 extends to the first surface 101 in order to electrically connect the gate control structures 40 to the control circuit 50. This electrical connection is only schematically illustrated in FIG. 1. Furthermore the topology of the cell structure and the depletion control structure may be different, e.g. the first one may exhibit a stripe-topology and the second one a cylindrical or rectangular or hexagonal topology. If both exhibit a stripe topology, the orientation may vary by an arbitrary angle.

Figure 5:
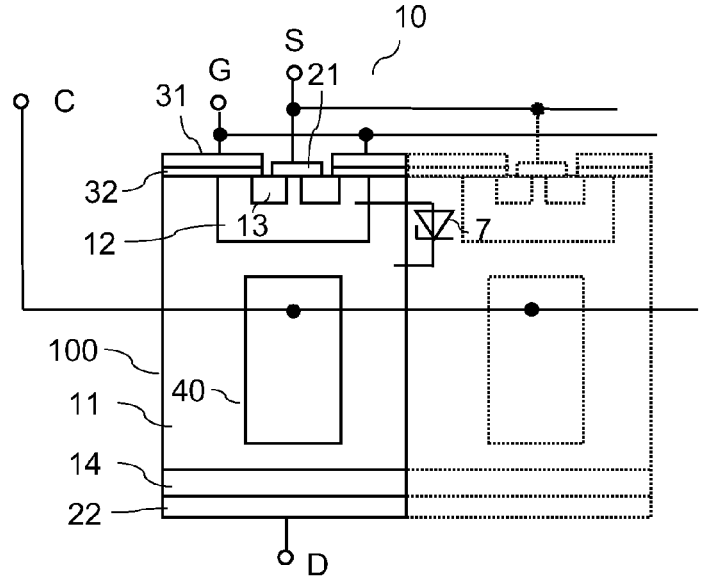
FIG. 5 illustrates a vertical cross sectional view of a transistor device with a planar gate electrode and a depletion control structure.

Implementing a MOSFET with a depletion control structure that is capable of deactivating an integrated body diode of the MOSFET is not restricted to a vertical MOSFET with a trench gate electrode and is not restricted to vertical MOSFETs in general. FIG. 5 schematically illustrates a vertical cross sectional view of a vertical transistor device with a planar gate electrode 31. The device according to FIG. 5 is based on the device according to FIG. 1 and is different from the device according to FIG. 1 in that the gate electrode 31 is arranged above the first surface 101 of the semiconductor body 100. In this transistor, the drift region 11 has sections that extend to the first surface 101. While in the transistor device according to FIG. 1 a conducting channel along the gate dielectric 32 extends in a vertical direction of the semiconductor body 100, a conducting channel along the gate dielectric 32 in the device according to FIG. 5 extends in a horizontal direction of the semiconductor body 100. A current flow direction, however, in the drift region 11 is the vertical direction of the semiconductor body 100 in both devices.

Figure 6:
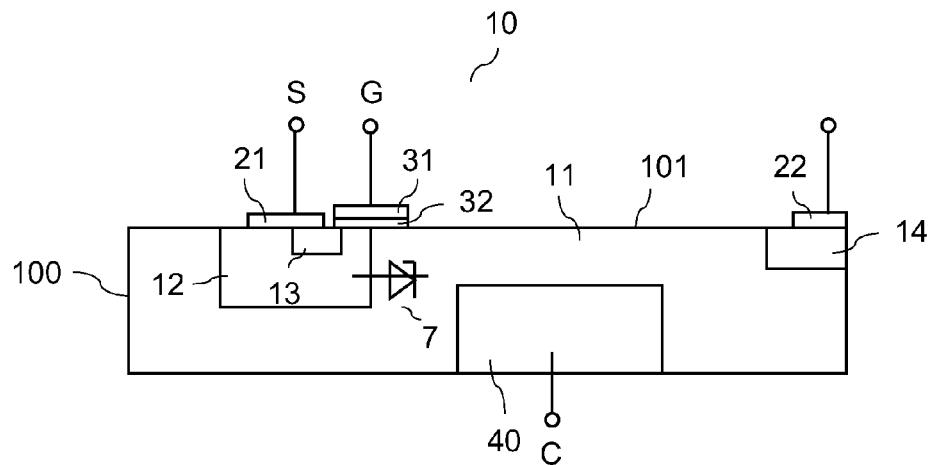
FIG. 6 illustrates a vertical cross sectional view of a lateral transistor device with a depletion control structure.

FIG. 6 illustrates a vertical cross sectional view of a lateral transistor device 10. In this device, the source region 13 and the drain region 14 are arranged distant in a lateral direction of the semiconductor body 100, and both, the source electrode 21 and the drain electrode 22 are arranged on the first surface 101 of the semiconductor body 100. In the embodiment illustrated in FIG. 6, the gate electrode 31 is a planar gate electrode arranged above the first surface 101. However, this gate electrode could also be implemented as a trench electrode. The depletion control structure 40 is arranged in the drift region 11 between the body region 12 and the drain region 14. FIG. 6 only illustrates a section of the semiconductor body 100 in a region closed to the first surface 101. A carrier or substrate is not illustrated in FIG. 6. Any conventional substrate, such as an SOI substrate or a semiconductor substrate doped complementarily to the drift region 11 may be used. In another embodiment (not shown) the depletion control structure 40 is arranged on the first surface 101 adjacent the drift region 11.

Figure 7:
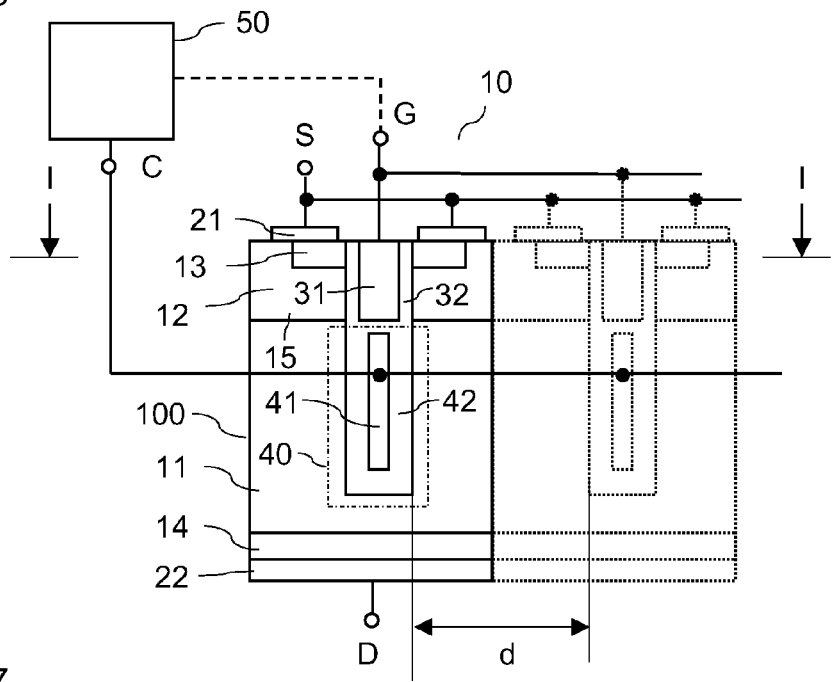
FIG. 7 illustrates a vertical cross sectional view of a transistor device including a depletion control structure with a field electrode and a field electrode dielectric.

Different specific embodiments of the depletion control structure 40 are explained with reference to FIGS. 5 to 8 below. The transistor devices 10 of FIGS. 5 to 7 are vertical MOSFETs with a trench gate electrode. However, implementing the transistor devices to be vertical MOSFETs with a trench gate electrode is only one example. The transistor devices of FIGS. 5 to 8 can easily be modified so as to obtain, for example, a vertical transistor device with a planar gate electrode, as explained with reference to FIG. 3, or so as to obtain a lateral transistor device, as explained with reference to FIG. 6. Everything which has been explained concerning the type of transistor device (MOSFET or IGBT, enhancement or depletion) and concerning the conduction type (n-type or p-type) applies to the transistors explained in the following as well. In FIGS. 3 to 5, measures for clamping the voltage between the body region 12 and the drift region 11 to a voltage below the forward voltage of the body diode are not illustrated. However, each of the measures explained with reference to FIG. 1 can be taken, such as providing a clamping element 7 and/or driving the gate electrode 31 to generate a conducting channel in the body region 12. In the following, generating a depletion region in the drift region 11 is always supported by suitable means that clamp the voltage between the body region 12 and the drift region 11 to a voltage below the forward region of the body diode.

In the embodiment illustrated in FIG. 7, the depletion control structure 40 includes a field electrode 41 and a field electrode dielectric 42 dielectrically insulating the field electrode 41 from the drift region 11. The field electrode 41 is electrically connected to the control terminal C that is connected to the control circuit 50. The field electrode 41 includes, for example, an electrically conductive material, such as a metal or a highly doped polycrystalline semiconductor material. The field electrode dielectric 42 includes, for example, at least one of an oxide and a nitride. According to one embodiment, the field electrode dielectric 42 is thicker than the gate dielectric 32.

In the embodiment illustrated in FIG. 7, the field electrode 41 and the field electrode dielectric 42 are arranged below the gate electrode 31 and the gate dielectric 32 in the same trench as the gate electrode 31 and the gate dielectric 32. However, this is only an example. The field electrode 41 and the field electrode dielectric 42 could also be arranged in a separate trench. The geometry of the field electrode 41 in a horizontal plane of the semiconductor body 100 may basically correspond to a geometry of the gate electrode 31. Thus, when the gate electrode 31 has, for example, a stripe-geometry or a grid-geometry, the field electrode 41 has a stripe-geometry or a grid-geometry, respectively.

The operating principle of the electronic circuit with the transistor device 10 and the control circuit 50 of FIG. 7 is explained now. For explanation purposes it is assumed that the transistor device is an n-type MOSFET. The explained operating principle also applies to a p-type MOSFET, wherein in a p-type MOSFET the polarity of voltages and potentials explained in the following is to be inverted.

When the transistor device 10 is in the reverse operation mode, so that the pn junction 15 is forward biased, the control circuit 50 biases the field electrode 41 such that a depletion region is generated in the drift region 11 around the field electrode dielectric 42. In an n-type MOSFET, the electrical potential to be applied to the field electrode 41 in order to generate a depletion region in the n-type drift region 11 is a negative electrical potential relative to the electrical potential of the drift region 11 and the drain region 14, respectively.

The control circuit 50 can be configured to either completely pinch off a conducting channel in the drift region 11 by driving the field electrode 41, or to partially pinch off a conducting channel in the drift region 11 between the drain region 14 and the body region 12. A channel in the drift region 11 is completely pinched off when depletion regions generated by depletion control structures of two neighboring transistor cells adjoin one another in a lateral direction of the semiconductor body 100. The conducting channel in the drift region 11 is only partially depleted when between the depletion regions generated by the depletion control structures of two neighboring transistor cells a non-depleted region of the drift region 11 remains. Whether the conducting channel in the drift region 11 is completely depleted or is not completely depleted is mainly dependent on three different factors, namely a distance d of two neighboring depletion control structures 40, a doping concentration of the drift region 11 between the depletion control structures 40, and a drive potential or drive voltage of the depletion control structure 40. At a given drive voltage or drive potential, the depletion region extends deeper into the semiconductor body 100 starting from one depletion control structure when the doping concentration of the drift region 11 decreases, and at a given doping concentration of the drift region 11, the depletion region extends deeper into the semiconductor body 100 when the absolute value of the drive potential or drive voltage increases. According to one embodiment a value of a drive voltage applied to the depletion control structure 40 is between 1V and −20V. The drive voltage is, for example, a voltage between the depletion control structure 40 and the source terminal S.

When in the reverse operation mode of the transistor device 10 the channel in the drift region 11 is completely pinched off, and the body diode is completely deactivated. Thus, no current flows between the source terminal S and the drain terminal D through the transistor device 10.

The transistor device 10 of FIG. 7 can be operated like a conventional transistor device, which means the transistor device 10 can be switched on and off in the forward operation mode by applying a suitable drive potential to the gate terminal G. The control circuit 50 is, for example, configured in the forward operation mode of the transistor device 10, that is when the body diode is reverse biased, to connect the depletion control structure 40 either to the source terminal S or to the gate terminal G, so that in the forward operation mode of the transistor device 10 the electrical potential of the field electrode 31 corresponds to the source potential or to the gate potential. Connecting the depletion control structure 40 to the gate or source potential has two different effects, dependent on whether the transistor is in an on-state (switched on) or in an off-state (switched off). When the transistor device 10 is switched on, and the field electrode 51 has source or gate potential, a depletion region that may have previously existed in a reverse operation mode of the transistor device 10, that is when the body diode was forward biased, is removed. When the transistor device 10 is switched off, a depletion region expands in the drift region 11 starting from the pn junction 15 but also from the depletion control structures 40. The expansion of this depletion region starting from the depletion structure 40 is by virtue of the voltage difference between the drain terminal D and the source and gate terminals S, G, respectively when the MOSFET is in its off-state. This is the operating principle of a conventional field electrode in the drift region of a conventional transistor with a field electrode. Thus, in the forward operation mode of the transistor device 10, the depletion control structure 40 can be operated like a conventional field electrode in the drift region of a conventional transistor device.

According to a further embodiment, when the transistor device 10 is in a forward operation state and when the transistor device 10 is switched on, the control circuit 50 is configured to generate an accumulation channel in the drift region 11 along the depletion control structure 40, specifically along the field electrode dielectric 42. In an n-type transistor an accumulation channel can be generated by applying a positive drive potential to the field electrode 41 relative to the electrical potential of the drain terminal D and the drift region 11, respectively. When the transistor device 10 is switched off in the forward operation mode, either source potential, gate potential or the same potential as in the reverse operation mode is applied to field electrode 41, in order to generate a depletion region in the drift region 11 when the transistor device 10 is in the forward operation mode and switched off.

Figure 8:
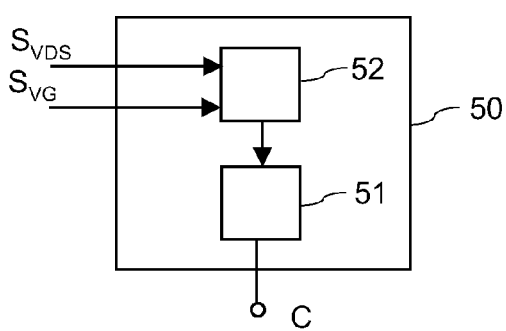
FIG. 8 illustrates a block diagram of one embodiment of the control circuit.

Referring to FIG. 8, in which a block diagram of the control circuit 50 according to one embodiment is shown, the control circuit 50 may include a voltage source arrangement 51 coupled to the control terminal C and capable of providing the required drive potential to the depletion control structure 40. The control circuit 50 may further include an operation mode detector 52 that detects the present operation mode of the transistor device 10. For this, the control circuit 50 may receive the load voltage signal $S_{VDS}$ representing a voltage between drain and source terminals D, S and a gate drive signal $S_{VG}$ reaches the signal applied to the gate terminal G of the MOSFET. In the forward operation mode of the transistor device 10, the gate drive signal $S_{VG}$ indicates whether the transistor device 10 is in the on-state or in the off-state. The load voltage signal $S_{VDS}$ indicates whether the transistor is operated in the forward operation mode or in the reverse operation mode. The operation mode detector 52 provides an information on the operation mode to the voltage source arrangement 51 that generates the drive potential at the control terminal C dependent on this information.

Figure 9:
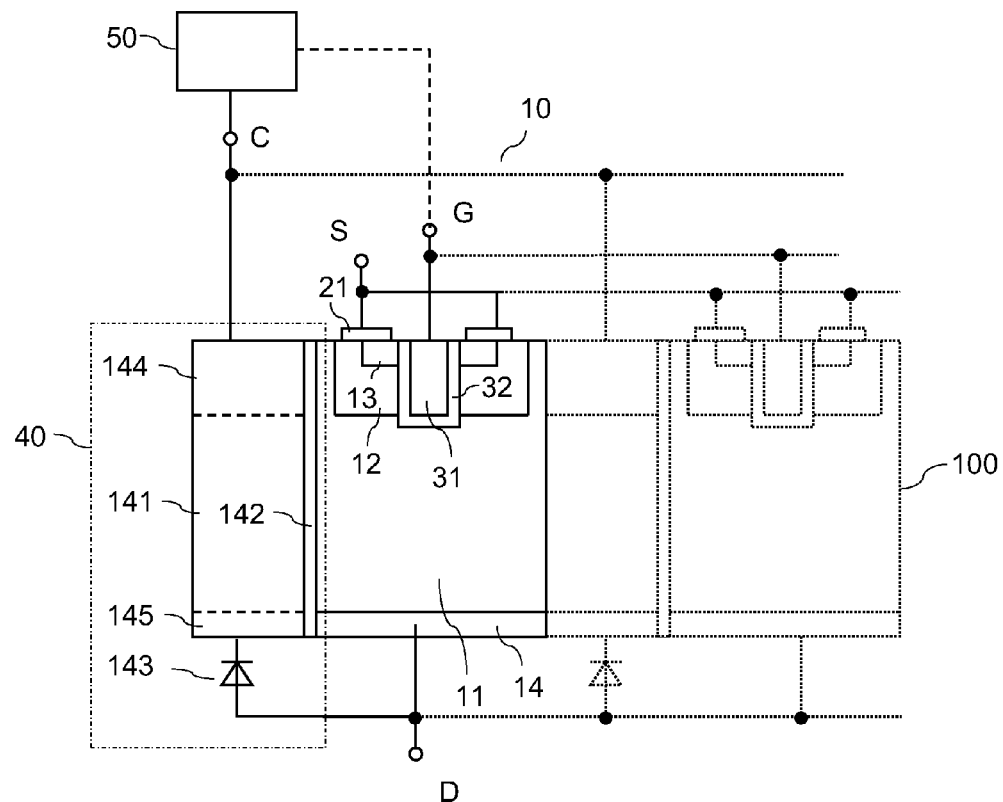
FIG. 9 illustrates a vertical cross sectional view of a transistor device including a depletion control structure with a drift control region and a drift control region dielectric.

FIG. 9 illustrates a vertical cross sectional view of a transistor device 10 according to a further embodiment. The depletion control structure 40 of this transistor device 10 includes a drift control region 141 arranged adjacent the drift region 11 and dielectrically insulated from the drift region 11 by a drift control region dielectric 142. The drift control region 141 is a monocrystalline semiconductor region and may have the same doping type as the drift region 11 or may be doped complementarily. Like the drift region 11, the drift control region 141 extends in a current flow direction of the transistor device 10, wherein in the embodiment illustrated in FIG. 9 the current flow direction of the transistor device 10 is a vertical direction of the semiconductor body 100. The drift control region 141 has a drain-sided end, which is an end arranged near the drain region 14, and a source-sided end, which is an end arranged near the source region 13. The drift control region 141 can be coupled to the drain region 14 via a rectifier element, such as a diode 143. For electrically connecting the rectifier element 143 to the drift control region 141, a contact region 145 can be arranged between the rectifier element 143 and the drift control region 141. The contact region 145 has the same doping type as the drift control region 141, but is more highly doped. The drift control region 141 is connected to the control terminal C of the depletion control structure 40. Optionally, a contact region 144 that is more highly doped than the drift control region 141 is connected between the drift control region 141 and the control terminal C. According to one embodiment, in an n-type transistor device 10, in which the drift region 11 is n-doped, the drift control region 141 is also n-doped, while the second contact region 144 is p-doped. In other embodiments the drift control region 141 is doped complementarily to the drift region 11.

Like the field electrode 41 illustrated in FIG. 7, the drift control region 141 according to FIG. 9 may generate a depletion region in the drift region 11 when the transistor device 10 is in the reverse operation mode. In an electronic circuit with an n-type transistor device 10 the control circuit 50 is configured to apply a negative electric potential to the drift control region 141 when the transistor device 10 is in the reverse operation mode. In this case a depletion region is generated in the drift region 11 along the drift control region dielectric 142. An expansion or a width of this depletion region in a direction perpendicular to the current flow direction of the transistor device 10 is dependent on a thickness of the drift control region dielectric 142, a doping concentration of the drift region 11 and the electrical potential applied to the drift control region 141. This is equivalent to the depletion control structure 40 of FIG. 7.

The control circuit 50 of FIG. 9 can be configured to drive the drift control structure 40 such that the depletion region generated in the drift region 11 completely pinches off a conducting channel in the drift region 11, or can be configured to only partially pinch off this conducting channel. This is also equivalent to the drift control structure 40 explained with reference to FIG. 9. In order to avoid the injection of (minority) charge carriers from the body region 12 into the drift region 11 during pinch off, the above mentioned methods for clamping the voltage between the body and drift regions 12, 11 can be applied.

When the transistor device 10 is in the forward operation mode, there are two different switching states, namely an on-state and an off-state. The control circuit 50 can be configured to generate an accumulation channel in the drift region 11 along the drift control region dielectric 142, when the transistor is in the on-state. For this, the control circuit 50 applies a positive potential to the drift control region 141 in an n-type MOSFET and a negative potential in a p-type MOSFET. By virtue of the monocrystalline semiconductor material of the drift control region 141 and of the optional connection regions 144, 145, a depletion region or space charge region can be generated in the drift control region 141 when the MOSFET is in the forward operation mode and in its off-state. This depletion region or space charge region follows a depletion region or space charge region generated in the drift region 11 when the MOSFET is in its off-state. The depletion regions on both sides of the drift control region dielectric 142, namely in the drift region 11 and the drift control region 141 helps to limit a voltage across the drift control region dielectric 142.

Figure 10:
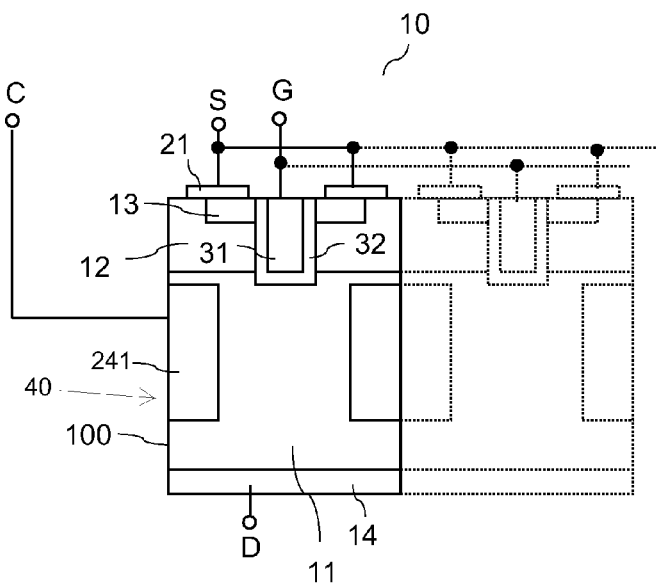
FIG. 10 illustrates a vertical cross sectional view of a transistor device including a depletion control structure with a region doped complementary to the drift region.

FIG. 10 illustrates a further embodiment of a transistor device 10 with a depletion control structure 40. In this embodiment, the depletion control structure 40 includes a semiconductor region 241 arranged in the drift region 11 and doped complementarily to the drift region 11. The control terminal C is connected to this semiconductor region 241. In this device, the drift region 11 with the complementary regions 241 acts like a JFET (junction field effect transistor) that is controlled by the control circuit 50 connected to the control terminal C. When the transistor device 10 is in the reverse operation mode, the control circuit 50 drives the complementary region 241 such that a depletion region is generated in the drift region 11. In an n-type MOSFET the control circuit 50 is configured to apply a negative potential relative to the drain potential D in order to generate a depletion region in the drift region 11. The control circuit 50, like the control circuit 50 of FIGS. 6 and 7, can be configured to completely pinch off a channel in the drift region 11 when the transistor device 10 is in the reverse operation mode, or can be configured to only partially pinch off this channel.

When the transistor device 10 is in the forward operation mode, the control circuit 50 is, for example, configured to apply the source potential, which is the electrical potential of the source terminal S, to the complementary region 241. In this case, a depletion region is also generated in the drift region 11 when the transistor device 10 is in its off-state, so that the electrical potential in the drift region 11 increases and a voltage difference between the potential in the drift region 11 an the electrical potential of the complementary region 241 increases. In this case, the complementary region 241 of the drift control structure acts like a conventional compensation region in a conventional super-junction transistor.

Figure 11:
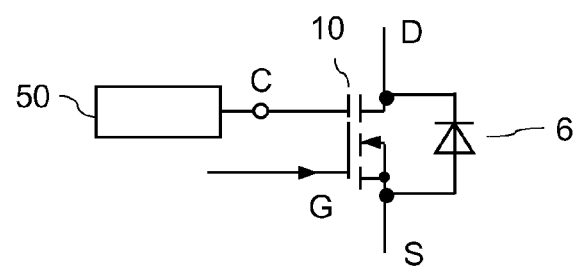
FIG. 11 illustrates an equivalent circuit diagram of the electronic circuit of FIGS. 1 and 2 to 7.

FIG. 11 illustrates an equivalent circuit diagram of the electronic circuit illustrated in FIGS. 1 to 8. The circuit symbol of the transistor device 10 is similar to the circuit symbol of a MOSFET, but includes an additional terminal C to which the control circuit 50 is connected to. The MOSFET can be operated like a conventional MOSFET, where the control circuit 50 is configured to apply a drive potential to the depletion control structure 40 dependent on the operation state of the MOSFET, as explained below.

Referring to FIG. 11, a rectifier element 6, such as a diode, can be connected between the drain and source terminals D, S of the transistor device 10. This rectifier element may 6 act as a freewheeling element. This rectifier element 6 is connected such that when connected in parallel to an n-type MOSFET a current may flow through the rectifier element 6 when a positive voltage is applied between the source and drain terminals S, D, and when connected in parallel to a p-type MOSFET a current may flow through the rectifier elements 6 when a negative voltage is applied between the source and drain terminals S, D. The rectifier element 6 can be implemented as a Schottky diode, a silicon carbide diode, a MOS gated diode or the like.

Figure 12:
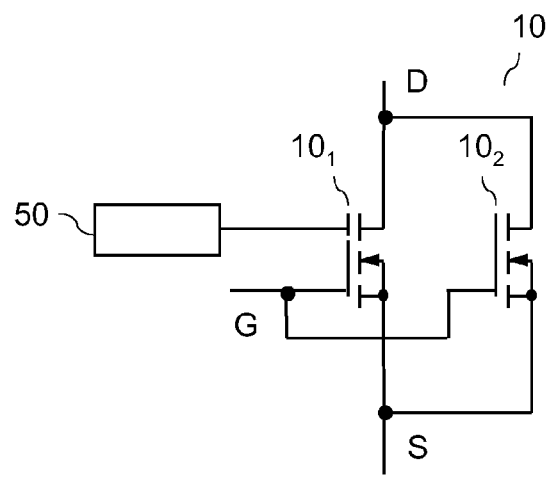
FIG. 12 illustrates an equivalent circuit diagram of an electronic circuit according to a further embodiment.

In the transistor devices illustrated in FIGS. 1, 3, and 5 to 8, each transistor cell includes a depletion control structure 40. However, this is only an example. According to a further embodiment, only some of the transistor cells include a depletion control structure 40. An equivalent circuit diagram of an electronic circuit with such a transistor device 10 is illustrated in FIG. 12. Referring to FIG. 12, the transistor device 10 can be considered as a parallel circuit with a conventional transistor $10_2$ and with a transistor $10_1$ having the depletion control structure 40 and a control circuit 50 connected to the depletion control structure 40. In a transistor device in which only some transistor cells have a depletion control structure 40, the body diode cannot be completely deactivated. However, the charge carrier plasma that is stored in the device when the body diode is forward biased can be reduced so as to reduce the switching losses in the device or circuit. This is due to avoiding plasma storage in the cells $10_1$ of the device.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", an and the are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An electronic circuit, comprising a transistor device that can be operated in a reverse operation mode and a control circuit, the transistor device comprising:
   a source region, a drain region, a body region and a drift region;
   a source electrode electrically connected to the source region;
   a pn junction formed between the body region and the drift region;
   a gate electrode adjacent the body region and dielectrically insulated from the body region; and
   a depletion control structure adjacent the drift region, the depletion control structure having a control terminal and configured to generate a depletion region in the drift region dependent on a drive signal received at the control terminal; and
   a clamping element coupled between the drift region and at least one of the source electrode and the body region and configured to clamp a voltage between the body region or the source electrode and the drift region to a voltage below a forward voltage of the pn junction between the body region and the drift region,
   wherein the transistor device is operated in the reverse operation mode when a voltage between the drain and source regions forward biases the pn junction between the body region and the drift region,
   wherein the control circuit is coupled to the control terminal of the depletion control structure and is configured to drive the depletion control structure to generate the depletion region in the drift region when the transistor device is operated in the reverse operation mode so that the transistor device is driven to block and current does not flow via the pn junction in the reverse operation mode.

2. The electronic circuit of claim 1, wherein the clamping element is a Schottky diode or a MOS Gated Diode (MGD).

3. The electronic circuit of claim 1, wherein the control circuit is further configured to drive the gate electrode to generate a conducting channel in the body region when the transistor device is operated in the reverse operation mode.

4. The electronic circuit of claim 1, wherein the depletion control structure further comprises:
   a field electrode arranged adjacent the drift region and coupled to the control terminal; and
   a field electrode dielectric between the field electrode and the drift region.

5. The electronic circuit of claim 4, wherein the field electrode comprises a metal or a polycrystalline semiconductor material.

6. The electronic circuit of claim 1, wherein the depletion control structure further comprises:
   a drift control region adjacent the drift region and coupled to the control terminal; and
   a drift control region dielectric between the drift control region and the drift region.

7. The electronic circuit of claim 6, wherein the drift control region comprises a monocrystalline semiconductor material.

8. The electronic circuit of claim 1, wherein the depletion control structure further comprises a region having a doping type complementary to the doping type of the drift region, adjoining the drift region and coupled to the control terminal.

9. The electronic circuit of claim 8, wherein the region of the complementary doping type comprises a monocrystalline semiconductor material.

10. The electronic circuit of claim 1, wherein a diode is connected between the source region and the drain region.

11. The electronic circuit of claim 10, wherein the diode is one of a MOS-Gated-Diode, a Schottky diode, and a silicon carbide diode.

12. The electronic circuit of claim 1, wherein the transistor device is a vertical transistor device.

13. The electronic circuit of claim 1, wherein the transistor device is a lateral transistor device.

14. The electronic circuit of claim 1, further comprising a gate drive circuit coupled to the gate electrode and configured to drive the gate electrode dependent on an input signal.

15. A method for operating a transistor device that can be operated in a reverse operation mode, the transistor device comprising a source region, a drain region, a body region and a drift region, a source electrode that is electrically connected to the source region, a pn junction formed between the body region and the drift region, a gate electrode arranged adjacent the body region and dielectrically insulated from the body region, and a depletion control structure arranged adjacent the drift region, having a control terminal, and configured to generate a depletion region in the drift region dependent on a drive signal received at the control terminal, the transistor device being operated in the reverse operation mode when a voltage between the drain and source regions forward biases the pn junction between the body region and the drift region the method comprising:
   driving the depletion control structure to generate the depletion region in the drift region when the transistor device is operated in the reverse operation mode so that the transistor device is driven to block and current does not flow via the pn junction in the reverse operation mode.

16. The method of claim 15, further comprising coupling a clamping element between the drift region and at least one of the body region and the source electrode, the clamping element configured to clamp a voltage between the body region or the source electrode and the drift region to a voltage below a forward voltage of the pn junction between the body region and the drift region.

17. The method of claim 16, wherein the clamping element is a Schottky diode or a MOS Gated Diode (MGD).

18. The method of claim 15, further comprising driving the gate electrode to generate a conducting channel in the body region when the transistor device is operated in the reverse operation mode.

19. The method of claim 15, wherein the depletion control structure further comprises:
   a field electrode arranged adjacent the drift region and coupled to the control terminal; and
   a field electrode dielectric between the field electrode and the drift region.

20. The method of claim 19, wherein the field electrode comprises a metal or a polycrystalline semiconductor material.

21. The method of claim 19, wherein the diode is a MOS-Gated-Diode, a Schottky diode, or a silicon carbide diode.

22. The method of claim 15, wherein the depletion control structure further comprises:
  a drift control region adjacent the drift region and coupled to the control terminal; and
  a drift control region dielectric between the drift control region and the drift region.

23. The method of claim 22, wherein the drift control region comprises a monocrystalline semiconductor material.

24. The method of claim 15, wherein the depletion control structure further comprises a region having a doping type complementary to the doping type of the drift region, adjoining the drift region and coupled to the control terminal.

25. The method of claim 24, wherein the region of the complementary doping type comprises a monocrystalline semiconductor material.

26. The method of claim 15, wherein a diode is connected between the source region and the drain region.

27. The method of claim 15, further comprising driving the gate electrode dependent on an input signal such that a conducting channel is generated in the body region along the gate dielectric when the transistor device is operated in the reverse operation mode.

28. An electronic circuit, comprising a transistor device that can be operated in a reverse operation mode and a control circuit, the transistor device comprising:
  a source region, a drain region, a body region and a drift region;
  a source electrode electrically connected to the source region;
  a pn junction formed between the body region and the drift region;
  a gate electrode adjacent the body region and dielectrically insulated from the body region; and
  a depletion control structure adjacent the drift region, the depletion control structure having a control terminal and configured to generate a depletion region in the drift region dependent on a drive signal received at the control terminal; and
  a diode connected between the source region and the drain region, the diode being one of a MOS-Gated-Diode, a Schottky diode and a silicon carbide diode,
wherein the transistor device is operated in the reverse operation mode when a voltage between the drain and source regions forward biases the pn junction between the body region and the drift region,
wherein the control circuit is coupled to the control terminal of the depletion control structure and is configured to drive the depletion control structure to generate the depletion region in the drift region when the transistor device is operated in the reverse operation mode so that the transistor device is driven to block and current does not flow via the pn junction in the reverse operation mode.

* * * * *